(12) United States Patent
Jung et al.

(10) Patent No.: US 6,829,742 B1
(45) Date of Patent: Dec. 7, 2004

(54) CODING METHOD AND CODING APPARATUS FOR CODING A SERIAL DATA STREAM

(75) Inventors: Peter Jung, Otterberg (DE); Joerg Plechinger, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/979,192
(22) PCT Filed: Oct. 27, 1999
(86) PCT No.: PCT/DE99/03462
§ 371 (c)(1),
(2), (4) Date: Feb. 19, 2002
(87) PCT Pub. No.: WO01/31795
PCT Pub. Date: May 3, 2001

(51) Int. Cl.[7] .......................... H03M 13/03; G06F 11/02
(52) U.S. Cl. ....................................... 714/790; 714/701
(58) Field of Search ................................ 714/790, 787, 714/788, 761, 762, 701

(56) References Cited

U.S. PATENT DOCUMENTS

| | | | |
|---|---|---|---|
| 5,721,745 A * | 2/1998 | Hladik et al. ............... | 714/755 |
| 5,907,582 A * | 5/1999 | Yi ............................... | 375/259 |
| 6,014,411 A * | 1/2000 | Wang .......................... | 375/259 |
| 6,704,368 B1 * | 3/2004 | Nefedov ..................... | 375/265 |

OTHER PUBLICATIONS

Caire, G.; Biglieri, E.; Parallel concatenated codes with unequal error protection, IEEE Transactions on Communications, vol. 46, Issue 5, May 1998, pp. 565–567.*

Açikel, O.F. and Ryan, W.E., "High Rate Turbo Codes for BPSK/QPSK Channels", *1998 IEEE International Conference on Communications*, vol. 1 of 3, pp. 422–427, 1998.
Burkert et al., "Turbo Decoding with Unequal Error Protection applied to GSM speech coding", Proceedings of Globecom'96, 1996 IEEE Global Telecommunications Conference, 3:2044–2048, 1996, XP002133421.
Burr, A.G. and White, G.P., "Comparison of iterative decoder performance with union bounds for short frame turbo codes", Annals of Telecommunications, 54:201–207, 1999.
Hindelang et al., "Using Powerful "Turbo" Codes For 14.4 KBIT/S Data Service in GSM or PCS Systems", Global Telecommunications Conference, IEEE, 649–653, 1997.
International Search Report.

* cited by examiner

*Primary Examiner*—Albert Decady
*Assistant Examiner*—Joseph D. Torres
(74) *Attorney, Agent, or Firm*—Fish & Richardson P.C.

(57) ABSTRACT

An initial data stream is coded using a first set of n coders to form n coded data streams, which are subsequently punctured by combining the n coded data streams with a first puncturing data field to form a first punctured data stream. The initial data stream is also interleaved using k interleaving circuits to produce k interleaved data streams, which are subsequently coded using a set of m coders to form m coded interleaved data streams. In addition, a second puncturing data field is interleaved to form an interleaved puncturing data field. The m coded interleaved data streams are subsequently punctured by combining the m coded interleaved data streams with the interleaved puncturing data field to form a second punctured data stream. The initial data stream, the first punctured data stream and the second punctured data stream are multiplexed to form a transmission data stream.

20 Claims, 3 Drawing Sheets

STATE OF THE ART

STATE OF THE ART

CODING METHOD AND CODING APPARATUS FOR CODING A SERIAL DATA STREAM

TITLE OF THE INVENTION

Coding method and coding apparatus for coding a serial data stream.

1. Field of the Invention

The invention relates to a coding method and a coding apparatus for coding a serial data stream using "turbo codes".

2. Background

The coding matches the data stream from an information data source to a transmission system in order to increase the security of information transmission against interference. In the mobile radio sector, the transmission channel is subject to particularly severe interference. A new class o- coders have therefore been developed, "turbo coders", which are particularly suitable for coding data to be transmitted in the mobile radio sector. Turbo coders are binary interlinked coding apparatuses comprising a plurality of interlinked coders. In this context, a distinction is drawn between serial-interlinked turbo coders and parallel-interlinked turbo coders.

FIG. 1 shows the design of a serial-interlinked turbo coding apparatus based on the prior art. A serial data stream d originating from an information data source is supplied to a data read-in device for reading in the data d, which reads in the data and codes them to form data frames of predetermined length. The data frames or data blocks are passed to a first coder A, which codes each data item within the data frame on the basis of a coding specification and outputs the coded data as a code data block C1 to an interleaving circuit. The interleaving circuit scrambles the coded data block C1 on the basis of an interleaving association specification stored in the interleaving circuit. The interleaving association specification or permutation matrix assigns to each data position within the code data block C1 a particular other data position. If the code data block comprises five bits, the interleaving circuit assigns the data item at the first position in the coded data block C1, for example, to the first position in the interleaved code data block C1', while, by way of example, the data bit situated at the second position in the code data block C1 is set to the third position of the interleaved code output data block C1'.

Table 1 shows an example of an interleaving association or interleaving specification in which an output data sequence is produced from an input data sequence on the basis of the interleaving association specification.

TABLE 1

| Input data sequence | $x_1$ | $x_2$ | $x_3$ | $x_4$ | $x_5$ |
|---|---|---|---|---|---|
| Output data sequence | $x_1$ | $x_3$ | $x_4$ | $x_5$ | $x_2$ |

As can be seen from Table 1, by way of example, the data bit read in at the second position is not output until at the fifth position in the output data block which is output.

The interleaved coded data block C1' is supplied to a downstream-connected coder B which carries out new coding to form a coded data block C2. The coded data block C2 is likewise interleaved by an interleaving circuit and is output via a modulation device to an antenna for data transmission. The coder A is also called the external coder, while the coder B is called the internal coder. The coder A, the interleaving circuit I1 and the coder B form the actual data channel coder.

The serial-interlinked turbo coding apparatus, as shown in FIG. 1, does not perform systematic coding, since the data contained in the original data stream are not themselves transmitted, but instead only coded data are transmitted.

The second group of turbo coders, namely the parallel-interlinked coders, also performs systematic coding. FIG. 2 shows the design of a parallel-interlinked turbo coder based on the prior art. A serial data stream originating from an information data source and having serial data d is read in by a data read-in device and is combined in groups to form data blocks X. Each data block X comprises a plurality of data bits $x_1$. The output of the data read-in device is connected to a first input of a multiplexer by means of a line L1. In addition, the output of the data read-in device is connected to the input of a first coder A by means of a line L2, said first coder coding the data block X on the basis of a coding specification to form a coded data block $C_1$, and outputting it to a puncturing device. In addition, the data block X output at the output of the data read-in device via a line L3 is interleaved or re-sorted by an interleaving circuit I on the basis of a prescribed permutation matrix. The interleaved data block I(X) is supplied to a second coder (B), which codes the interleaved data block I(X) on the basis of a coding specification to form a code data block $C_2$. The coded data block $C_2$ is likewise supplied to the puncturing device P.

The puncturing device P logically combines the coded data block $C_1$ and the coded data block $C_2$ with a respective associated puncturing data field. The puncturing by the puncturing device P is carried out in order to increase the data transmission rate. The punctured coded data block P ($C_1$) and the punctured data block P ($C_2$) are applied to inputs of the multiplexer, which subjects the data block X which is read in and the two punctured data blocks P($C_1$) and P($C_2$) to time-division multiplexing to form a transmission data block S.

The text below describes the exact manner of operation of the parallel-interlinked turbo coder based on the prior art, as shown in FIG. 2, using an example to illustrate the problem on which the invention is based. In this example, the length of the data frame is 5 bits.

From a data source, a serial data stream is read in by the data read-in device and is coded to form a data block X comprising 5 bits:

$$x=(x_1,x_2,x_3,x_4,x_5)$$

The coder A codes the read-in data block X on the basis of a coding specification to form a code data block $C_1$:

$$C_1=(c_{11},c_{12},c_{13},c_{14},c_{15})$$

The interleaving circuit I interleaves the read-in data block X on the basis of the following interleaving association, for example:

TABLE 2

| Input X | Output I(x) |
|---|---|
| $x_1$ | $x_1$ |
| $x_2$ | $x_3$ |
| $x_3$ | $x_4$ |

TABLE 2-continued

| Input X | Output I(x) |
|---|---|
| $x_4$ | $x_5$ |
| $x_5$ | $x_2$ |

The interleaved data block I(x) is supplied to the coder B, which codes the interleaved data block on the basis of a coding specification to form a coded data block $C_2$:

$$C_2 = (c_{21}, c_{22}, c_{23}, c_{24}, c_{25})$$

To increase the data transmission rate, the puncturing device P punctures the data block $C_1$ coded by the coder A and the data block $C_2$ coded by the coder B using a respective associated puncturing data field.

The puncturing data field for puncturing the first coded data block $C_1$ is as follows:

$$P_1 = (10101)$$

The puncturing data field for puncturing the second coded data block $C_2$ is as follows:

$$P_2 = (01010)$$

By logically combining the first coded data block $C_1$ with the puncturing data field $P_1$, a punctured coded data block $P(C_1)$ having the following form is produced:

$$P(C_1) = (c_{11}, 0, c_{23}, 0, c_{25})$$

By puncturing the second coded data block $C_2$, a punctured coded data block $P(C_2)$ is produced:

$$P(C_2) = (0, c_{22}, 0, c_{24}, 0)$$

The multiplexer Mux multiplexes the read-in data block X and also the two punctured and coded data blocks $P(C_1)$, $P(C_2)$ output by the puncturing device P to form a transmission data block S.

TABLE 3

X = $(x_1, x_2, x_3, x_4, x_5)$
$P(C_1) = (c_{11}, 0, c_{13}, 0, c_{15})$,
$P(C_2) = (0, c_{22}, 0, c_{24}, 0)$
S = $(x_1, c_{11}, x_2, c_{22}, x_3, c_{13}, x_4, c_{24}, x_5, c_{15})$

The transmission data block S, contains, firstly, a systematic coding information content, because the original read-in data $x_1, x_2, x_3, x_4, x_5$ are contained In the transmission data block S, and, secondly, the transmission data block S contains a nonsystematic information content, on account of the coded data c.

However, the parallel-interlinked turbo coding apparatus based on the prior art, as shown in FIG. 2, has the drawback that an associated, nonsystematic coded data bit c is not transmitted as nonsystematic information content for each original data bit of the read-in data block X, as becomes evident from the following table:

TABLE 4

| X | = | $x_1$ | $x_2$ | $x_3$ | $x_4$ | $x_5$ |
|---|---|---|---|---|---|---|
| $C_1$ | = | $c_{11}$ | $c_{12}$ | $c_{13}$ | $c_{14}$ | $c_{15}$ |
| I(x) | = | $x_1$ | $x_3$ | $x_4$ | $x_5$ | $x_2$ |
| $C_2$ | = | $c_{21}$ | $c_{22}$ | $c_{23}$ | $c_{24}$ | $c_{25}$ |

The coded data bits $c_{11}, c_{22}, c_{13}, c_{24}, c_{15}$ which are contained in the transmission data block S and form the nonsystematic information content of the transmission data block S represent coded data bits for the original data bits $x_1$, $x_3$, $x_3$, $x_5$ and $x_5$. For the original data bits $x_2$ and $x_4$, no coded data bits c are contained in the transmission data block S. The original data bits $x_2$, $x_4$ are transmitted merely systematically. The absence of the coded data bits for the original data $x_2$ and $x_4$ makes the nonsystematic information content of the transmission data block S lower than in a case in which each information data bit x has a corresponding coded data bit c transmitted for it. Accordingly, the bit error radio BFV rises with decreasing nonsystematic information content within the transmission data block S.

It is therefore the object of the present invention to provide a coding method and a coding apparatus for coding a serial data stream in which the nonsystematic information content of the coded transmission data stream is at a maximum.

The invention provides a coding method for coding a serial data stream having the following steps:
 a data stream output by a data source is coded using at least one coder to form a coded data stream;
 the data stream output by the data source is interleaved on the basis of predetermined interleaving associations to form at least one interleaved data stream;
 the Interleaved data streams are coded using associated coders to form coded interleaved data streams; the coded data streams and the coded interleaved data streams are punctured by logic combination with associated puncturing data fields,
 the puncturing data field for puncturing a coded interleaved data stream being interleaved before logic combination using that interleaving association which was used to interleave the coded interleaved data stream;
 the data stream output by the data source and the punctured data streams are multiplexed to form a transmission data stream.

Advantageous refinements of the method according to the invention are specified in the subordinate subclaims.

The serial data stream output by the data source is preferably read in block by block for coding purposes.

In one preferred development, the interleaving association for interleaving the puncturing data field is read from the associated interleaving circuit. The interleaving association is preferably set.

In one preferred development, puncturing is effected by logically combining a data stream with a puncturing data field using a logic circuit.

The invention also provides a coding apparatus for coding a serial data stream having,
 a data input for applying the serial data stream;
 at least one coder, connected to the data input, for coding the data stream to form a coded data stream;
 at east one interleaving circuit, connected to the data input, for interleaving the data stream to form an interleaved data stream on the basis of an interleaving association, the Interleaved data stream being coded by a coder, connected downstream or the interleaving circuits, to form a coded interleaved data stream;

a puncturing device for puncturing the coded data stream and the coded interleaved data stream using a respective puncturing circuit by logically combining the data stream with a puncturing data field to form punctured data streams, the puncturing device having a puncturing interleaving circuit which interleaves the puncturing data field for puncturing the coded interleaved data stream on the basis of the associated interleaving association and outputs it to the puncturing circuit for logic combination with the coded interleaved data stream; and having a multiplexer for multiplexing the serial data stream and the punctured data streams output by the puncturing device to form a transmission data stream.

In one preferred development of the coding apparatus according to the invention, the puncturing interleaving circuit is connected to the associated interleaving circuit by means of a read line for reading the interleaving association.

The interleaving circuits preferably each have a memory for storing the interleaving associations.

In one preferred development, the interleaving association in the interleaving circuits can be set using a respective setting line.

In one preferred embodiment of the coding apparatus according to the invention, the puncturing data fields can each be stored in memories in the puncturing device.

Preferably, the puncturing data fields can be set using respective setting lines.

Preferably, the puncturing circuit is a logic circuit for logically combining the data stream with the puncturing data field.

In accordance with one preferred development, the puncturing data Field contains a plurality of data elements which respectively adopt a logic high H-state or a logic low L-state.

In accordance with one preferred embodiment, the coding apparatus according to the invention has a data read-in device which reads in the serial data stream applied to the data input in order to output data blocks of determined length.

In this context, the length of the data blocks can preferably be set.

In accordance with another preferred development, the coders are recursive systematic convolutional coders.

The text below describes a preferred embodiment of the coding method according to the invention and of the coding apparatus according to the invention with reference to the appended drawings in order to illustrate features which are fundamental to the invention.

BRIEF DESCRIPTION OF THE INVENTION

DESCRIPTION

Figure 1:
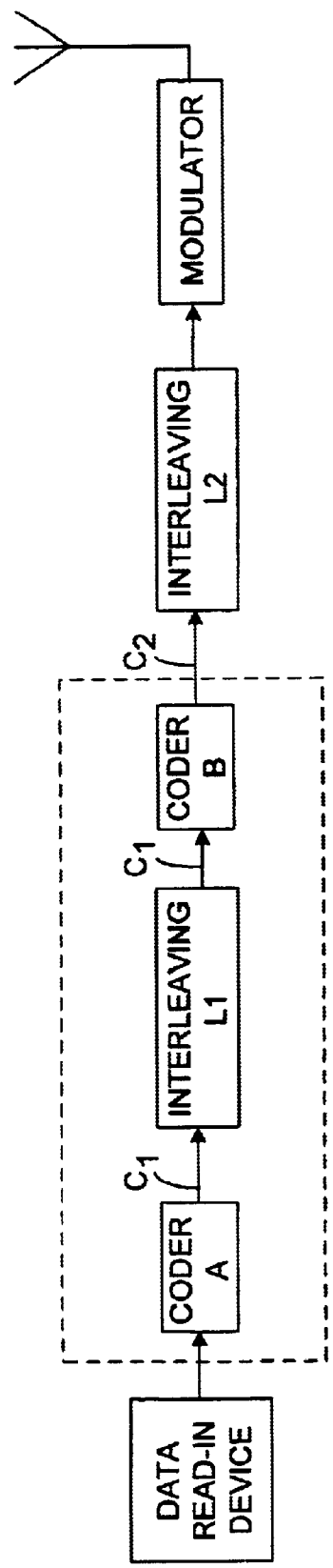
FIG. 1 shows a serial-interlinked turbo coder based on the prior art.
Figure 2:
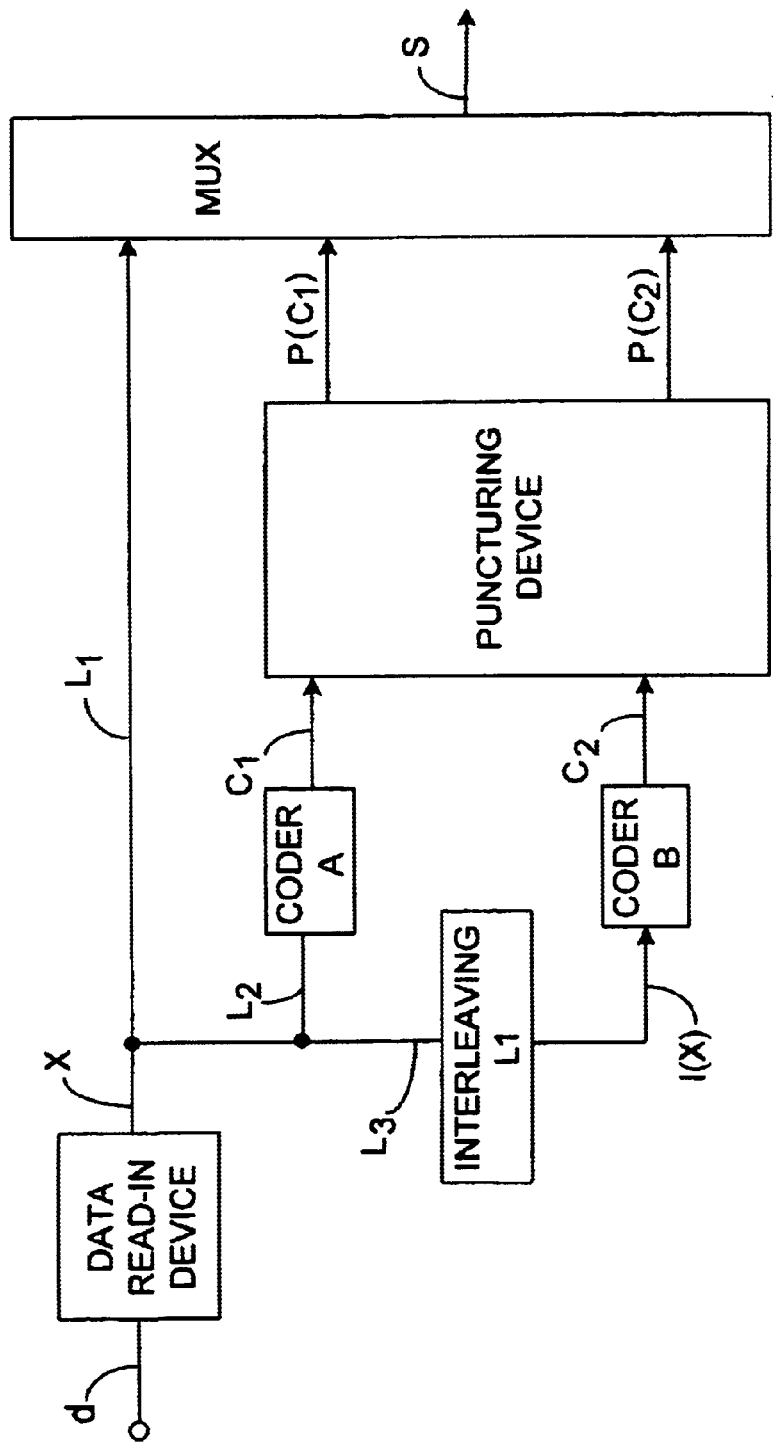
FIG. 2 shows a parallel-interlinked turbo coder based on the prior art.
Figure 3:
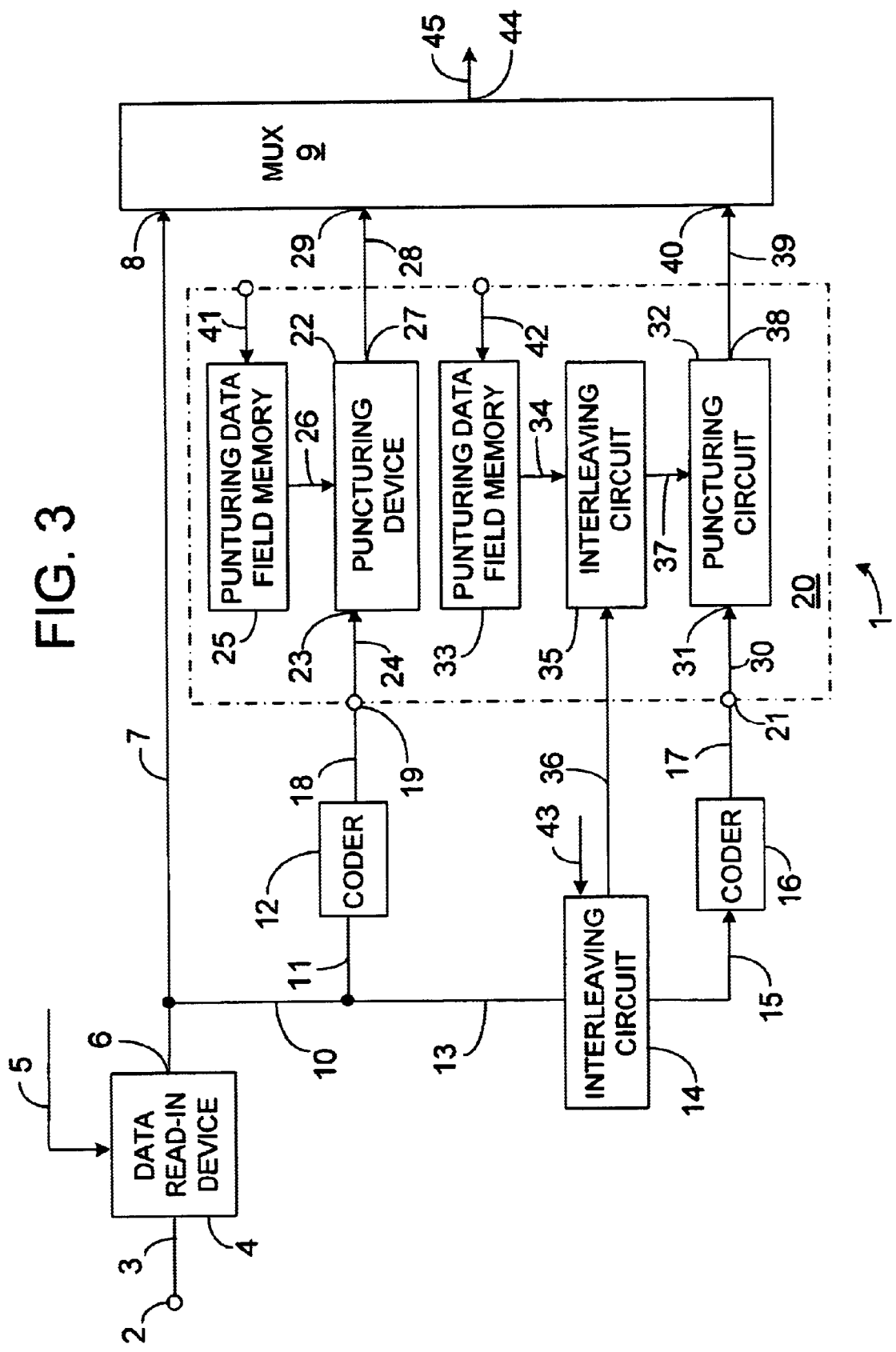
FIG. 3 shows an inventive coding apparatus for coding a serial data stream.

The inventive coding apparatus 1 for coding a serial data stream, as shown in FIG. 3, has a data input 2 to which a serial data stream output by an information data source is applied. The serial data stream is supplied by means of a line 3 to a data read-in device 4 which reads in the serial data and groups them to form data blocks. The length of the data blocks or data frames can be set using a setting line 5. The signal output 6 of the data read-in device 4 outputs the data blocks to a first signal input 8 of a multiplexer 9 via a line 7. The data blocks at the signal output 6 of the data read-in device 4 are also supplied, by means of internal lines 10, 11, to a first coder 12 for the purposes of coding using a first predetermined coding specification. In addition, the data blocks provided at the signal output 6 of the data read-in device 4 are passed via internal lines 10, 13 to an interleaving circuit 14 which interleaves or resorts those data which are contained in the data block on the basis of an interleaving association using a stored permutation matrix, and outputs the interleaved data block at the output to a second coder 16 via a line 15. The coder 16 codes the interleaved data stream present on the line 15 or the applied interleaved data block on the basis of a predetermined coding specification to form a coded interleaved data stream which is output via a line 17.

The data stream coded by the coder 12 is supplied to a first signal input 19 of a puncturing device 20 via an output line 18. The puncturing device 20 has a further signal input 21, which is connected to the output line 17 of the coder 16 in order to receive the coded interleaved data stream.

The puncturing device 20 contains a first puncturing circuit 22, whose input 23 is connected by means of a signal line 24 to the signal line connection 19 of the puncturing device 20. The puncturing circuit 22 punctures the coded data stream received from the coder 12 using a puncturing data field which is stored in a first memory 25 of the Puncturing device 20. The puncturing circuit 22 logically combines the puncturing data field stored in the puncturing data field memory 25 by reading the puncturing data field from the memory 25 via a line 26 and using a logic circuit to logically combine it bit by bit with the coded data stream at the signal input 23. The puncturing data field stored in the puncturing data field memory 25 has a plurality of data elements which each adopt a logic high H-state or a logic low L-state. The data elements contained in the puncturing data field are preferably logically combined bit by bit with the coded data stream applied to the signal input 23 using a logic AND function. For this purpose, each data bit of the data block or data frame applied to the signal input 23 is logic ANDed with a corresponding data element of the puncturing data field. Puncturing the coded data stream using the puncturing circuit 22 serves to increase the transmission bit rate. The punctured coded data stream is output to a signal output 27 of the puncturing circuit 22 and is applied to a second signal input 29 of the multiplexer 9 via a line 28.

The coded interleaved data stream applied to the signal input 21 of the puncturing device 20 is supplied via an internal line 30 to a signal input 31 of a second puncturing circuit 32 contained in the puncturing device 20. The puncturing data field stored in a second puncturing data field memory 33 of the puncturing device 20 is read via a line 34 into a puncturing interleaving circuit 35, where it is interleaved or re-sorted using an interleaving association which is identical to that interleaving association of the interleaving circuit 14. For this purpose, the interleaving circuit 35 is preferably connected to the interleaving circuit 14 by means of a read line 36 for reading the associated interleaving association. The interleaving association specification read into the interleaving circuit 35 of the puncturing device 20 via the read line 36 is applied to the puncturing data field stored in the puncturing data field memory and is passed, as Interleaved puncturing data field, via a line 37 to the puncturing circuit 32, which logically combines the coded interleaved data stream applied to the signal input 31 with the interleaved puncturing data field in order to output a punctured coded interleaved data stream to a signal output 38 of the puncturing circuit 32. The coded interleaved data stream, punctured by the puncturing circuit 32, is passed via a line 39 to a third signal input 40 of the multiplexer 9.

The puncturing data fields stored in the two puncturing data field memories 25, 33 can preferably be set using setting lines 41, 42. In addition, in one preferred embodiment, the interleaving association is input into the interleaving circuit 14 via a setting line 43. The multiplexer 9 multiplexes the data streams applied to the signal inputs 8, 29, 40, i.e. the serial data stream applied to the signal input 8, the coded serial data stream, punctured by the puncturing circuit 22, applied to the signal input 29 and also the coded interleaved serial data stream, punctured by the puncturing circuit 32, applied to the signal input 40, so that a transmission data stream S is output at the signal output 44 of the multiplexer 9 via signal line 45.

In the inventive coding apparatus shown in FIG. 3, the nonsystematic information content is at a maximum, which means that the bit error ratio becomes minimal when the transmission data stream S is transmitted via a transmission channel.

This becomes clear from the example below.

By way of example, the data read-in device 4 reads in a data block X comprising five bits.

$$X = (x_1, x_2, x_3, x_4, x_5)$$

The coder 12 codes the read-in data block X using a prescribed coding specification to form a coded data block $C_1$.

$$C_1 = (c_{11}, c_{12}, c_{13}, c_{14}, c_{15})$$

The interleaving circuit 14 interleaves the data block X on the basis of an interleaving association.

TABLE 2

| Input X | Output I(x) |
|---------|-------------|
| $x_1$   | $x_1$       |
| $x_2$   | $x_3$       |
| $x_3$   | $x_4$       |
| $x_4$   | $x_5$       |
| $x_5$   | $x_2$       |

The coder 16 codes the data block interleaved by the interleaving circuit on the basis of the interleaving association in accordance with a prescribed coding specification to form a coded interleaved data block $C_2$.

$$C_2 = (c_{21}, c_{22}, c_{23}, c_{24}, c_{25})$$

The puncturing data field memory 25 stores a first puncturing data field $P_1$.

$$P_1 = (10101)$$

The puncturing data field memory 33 stores a second puncturing data field $P_2$.

$$P_2 = (01010)$$

The interleaving circuit 35 reads the interleaving association buffer-stored in the interleaving circuit 14 and interleaves the puncturing data field's data elements stored in the puncturing data field memory 33 on the basis of this interleaving association to form an interleaved puncturing data field $I(P_2)$.

TABLE 5

| $P_2$ | $I(P_2)$ |
|-------|----------|
| 0     | 0        |
| 1     | 0        |
| 0     | 1        |
| 1     | 0        |
| 0     | 1        |

The puncturing circuit 32 logically combines the interleaved puncturing data field $I(P_2)$ with the coded interleaved data block $C_2$ applied to the signal input 31 to form a punctured data stream $P_2'$ ($C_2$), where $P'_2 = I(P_2)$.

With $I(P_2) = (0, 0, 1, 0, 1)$ and with $C_2 = (c_{21}, c_{22}, c_{23}, c_{24}, c_{25})$, the result is a punctured coded interleaved data stream $P_2'$ ($C_2$) at the signal output 38 of the puncturing circuit 32 of: $(0, 0, c_{23}, 0, c_{25})$ Hence, the following data blocks are applied to the signal inputs 8, 29, 40:

TABLE 6

| Signal input 8  | $x_1, x_2, x_3, x_4, x_5$       |
| Signal input 29 | $c_{11}, 0, x_{13}, 0, c_{15}$  |
| Signal input 40 | $0, 0, c_{23}, 0, c_{25}$       |

The multiplexer 9 multiplexes the three serial data items applied to the signal inputs 8, 29, 40 to form a transmission data stream S.

$$S = x_1, c_{11}, x_2, x_3, c_{13}, c_{23}, x_4, x_5, c_{15}, c_{25}$$

As can be seen from the table below, a coded data bit c is transmitted as nonsystematic coding content of the transmission data stream for each original data bit $x_i$ of the read-in data block X.

TABLE 7

| X    | = | $x_1$    | $x_2$    | $x_3$    | $x_4$    | $x_5$    |
|------|---|----------|----------|----------|----------|----------|
| $C_1$| = | $c_{11}$ | $c_{12}$ | $c_{13}$ | $c_{14}$ | $c_{15}$ |
| I(x) | = | $x_1$    | $x_3$    | $x_4$    | $x_5$    | $x_2$    |
| $C_2$| = | $c_{21}$ | $c_{22}$ | $c_{23}$ | $c_{24}$ | $c_{25}$ |

Thus, the coded data bit $C_{11}$ is generated from the original data bit $x_1$, the coded data bit $cl_3$ is generated from the original data bit $x_3$, the coded data bit $c_{23}$ is generated from the original data bit $x_4$, the coded data bit $c_{15}$ is generated from the original data bit $x_5$ and the coded data bit $c_{25}$ is generated from the original data bit $x_2$. The nonsystematic coding content of the transmission data block S is thus at a maximum, as a result or which the bit error ratio becomes minimal for transmissions of the transmission data block S via a transmission channel.

In the coding apparatus according to the invention, the maximization of the nonsystematic coding content within the transmission data block is achieved by coupling the puncturing device 20 to the interleaving circuit 14, from which the interleaving association is read via the line 36 in order to interleave the puncturing data field $P_2$.

The puncturing of the serial data stream may be different for various data bit sequences of the data stream. The data stream received from the data source is read in block by block for the purposes of further coding. In this context, the read-in data block X can have a plurality of successive data sequences $X_1$, $X_2$ of different significance or importance. In this case, a first data sequence $X_1$ of the read-in data block X contains, by way of example, information which is of greater significance as compared with the information in another data sequence $X_2$ of the read-in data block X. To ensure interference-free data transmission, the data bits of the data sequence $X_1$ are therefore preferably protected using a lower code rate than the less significant data bits of the data sequence $X_2$ of the read-in data block X. This is achieved using a puncturing data field P which has a first puncturing data element sequence $P_a$, whose data elements are all in a logic H-state, and which has a second puncturing data element sequence $P_b$, whose data elements are alternately in a logic high H-state and in a logic low L-state. The data bits of the first data sequence $X_1$ of the read-in data block X are thus not punctured by the first puncturing data element sequence $P_a$ of the puncturing data field P, which means that a code rate of ⅓ is produced for these significant data bits together with the systematic bits. The alternating puncturing of the successive data sequence $X_2$ of the data block X using the second puncturing data element sequence $P_b$ transmits exactly one nonsystematic bit together with a systematic bit in each case, so that a code rate of ½ is produced.

The unequal puncturing of the various data sequences of the serial data stream means that unequal error protection is implemented, where the significant data bits $x_1$ are especially protected by a low code rate. The simple production of unequal error protection for data sequences $X_1$ which contain important information and data sequences $X_2$ which contain less important information allows the same decoder co be used for both data sequences.

Unequal error protection is thus ensured in a very simple manner in terms of circuitry. In addition, the nonuniform error protection in the inventive coding apparatus is particularly flexible, since the puncturing data fields P stored in the puncturing data fields 25, 33 can be set flexibly using the setting lines 41, 42 on the basis of a known data sequence format of the serial data stream.

| | List of reference symbols |
|---|---|
| 1 | Coding apparatus |
| 2 | Data input |
| 3 | Line |
| 4 | Data read-in device |
| 5 | Setting line |
| 6 | Signal output |
| 7 | Line |
| 8 | Signal input of the multiplexer |
| 9 | Multiplexer |
| 10 | Line |
| 11 | Line |
| 12 | Coder |
| 13 | Line |
| 14 | Interleaving circuit |
| 15 | Line |
| 16 | Coder |
| 17 | Line |
| 18 | Line |
| 19 | Signal input of the puncturing device |
| 20 | Puncturing device |
| 21 | Signal input of the puncturing device |
| 22 | Puncturing circuit |
| 23 | Signal input of the puncturing circuit |
| 24 | Line |
| 25 | Puncturing data field memory |
| 26 | Line |
| 27 | Signal output of the puncturing circuit |

-continued

| | List of reference symbols |
|---|---|
| 28 | Line |
| 29 | Signal input of the multiplexer |
| 30 | Line |
| 31 | Signal input of the puncturing circuit |
| 32 | Puncturing circuit |
| 33 | Puncturing data field memory |
| 34 | Line |
| 35 | Puncturing interleaving circuit |
| 36 | Read line |
| 37 | Line |
| 38 | Signal output of the puncturing circuit |
| 39 | Line |
| 40 | Signal input of the multiplexer |
| 41 | Setting line |
| 42 | Setting line |
| 43 | Setting line |
| 44 | Signal output of the multiplexer |
| 45 | Transmission signal line |

What is claimed is:

1. A coding method comprising:

coding an initial data stream to form n coded data streams using a first set of n coders, where n≧1, the initial data stream including a sequence of data bits;

interleaving the initial data stream using k interleaving circuits by applying a group of predetermined interleaving associations to form k interleaved data streams, where k≧1;

coding the k interleaved data streams to form m coded interleaved data streams using a second set of m coders, where m≧1;

puncturing the n coded data streams to form a first punctured data stream by logically combining the n coded data streams with a first puncturing data field;

interleaving a second puncturing data field based on the group of predetermined interleaving associations to form an interleaved puncturing data field;

puncturing the m coded interleaved data streams to form a second punctured data stream by logically combining the m coded interleaved data streams with the interleaved puncturing data field; and multiplexing the initial data stream, the first punctured data stream, and the second punctured data stream to form a transmission data stream, the transmission data stream including a data bit and a corresponding coded data bit generated by the data bit.

2. The method of claim 1, further comprising receiving the initial data stream by reading the initial data stream block by block.

3. The method of claim 1, further comprising reading the group of predetermined interleaving associations from the k interleaving circuits.

4. The method of claim 1, further comprising adjusting the group of predetermined interleaving associations.

5. The method of claim 1, wherein puncturing the n coded data streams includes using a logic circuit to logically combine the n coded data streams with the first puncturing data field.

6. The method of claim 1, wherein puncturing the m coded interleaved data streams includes combining the m coded interleaved data streams with the interleaved puncturing data field.

7. A coding apparatus for coding a serial data stream, the coding apparatus comprising:

a first set of n coders connected to a data input, the first set of n coders being configured to form n coded data streams from the serial data stream, where n≧1;

k interleaving circuits connected to the data in put, the k interleaving circuits forming k interleaved data streams from the serial data stream by applying a group of predetermined interleaving associations, where $k \geq 1$;

a second set of m coders, connected to an output of the k interleaving circuits, the second set of m coders forming m coded interleaved data streams from the k interleaved data streams, where $m \geq 1$;

a puncturing device, the puncturing device including:
- a first puncturing circuit for puncturing the n coded data streams by logically combining the n coded data streams with a first puncturing data field to form a first punctured data stream;
- a puncturing interleaving circuit for interleaving a second puncturing data field using the group of predetermined associations to form an interleaved puncturing data field; and
- a second puncturing circuit, the second puncturing circuit puncturing the m coded interleaved data streams by logically combining the m coded interleaved data streams with the interleaved puncturing data field to form a second punctured data stream; and a multiplexer multiplexing the serial data stream, the first punctured data stream, and the second punctured data stream to form a transmission data stream, the transmission data stream including a data bit and a corresponding coded data bit generated by the data bit.

8. The apparatus of claim 7, further comprising a read line connecting the puncturing interleaving circuit to each interleaving circuit.

9. The apparatus of claim 7, further comprising a memory located at each interleaving circuit, the memory being configured to store the group of predetermined interleaving associations.

10. The apparatus of claim 7, further comprising a setting line configured to adjust each interleaving association.

11. The apparatus of claim 7, further comprising a memory located in the puncturing device, the memory being configured to store the first puncturing data field and the second puncturing data field.

12. The apparatus of claim 7, further comprising a first setting line configured to adjust the first puncturing data field and a second data field configured to adjust the second puncturing data field.

13. The apparatus of claim 7, further comprising a puncturing device including a logic circuit for logically combining the n coded data streams with the first puncturing data field.

14. The apparatus of claim 7, further comprising a puncturing device including a logic circuit for logically combining the m coded interleaved data streams with the interleaved puncturing data field.

15. The apparatus of claim 7, further comprising a data read-in device, the data read-in device being configured to read and group the serial data stream to output data blocks of predetermined length.

16. The apparatus of claim 15, further comprising a setting line configured to adjust the length of the data blocks.

17. The apparatus of claim 7, wherein the first set of n coders and the second set of m coders are sets of recursive systematic convolutional coders.

18. The apparatus of claim 7, wherein the first puncturing data field and the second puncturing data field each contain a plurality of data elements, each data element being in a logic high state or a logic low state.

19. The apparatus of claim 7, wherein the first puncturing data field and the second puncturing data field each have a plurality of different data element sequences for puncturing data sequences of the serial data stream.

20. The apparatus of claim 7, wherein the first puncturing data field and the second puncturing data field each have a first data element sequence, the data elements of which are in a logic high state for puncturing a first data sequence of the serial data stream, and a second data element sequence, the data elements of which are alternately in a logic high state and a logic low state for puncturing a second data sequence of the serial data stream.

* * * * *